United States Patent [19]

Nakamura et al.

[11] Patent Number: 4,593,269
[45] Date of Patent: Jun. 3, 1986

[54] COMPACT OPTIONAL ROTARY ENCODER HAVING ADJUSTABLE LIGHT ADMITTING AND RECEIVING COMPONENTS

[75] Inventors: Yoshimitsu Nakamura, Settsu; Kazuhisa Takahashi, Shijonawate; Kazuhiro Mishina, Hirakata, all of Japan

[73] Assignee: Matsushita Electric Works, Ltd., Osaka, Japan

[21] Appl. No.: 667,807

[22] Filed: Nov. 2, 1984

[30] Foreign Application Priority Data

Nov. 15, 1983 [JP] Japan .............................. 58-215304

[51] Int. Cl.⁴ .................. G01D 5/34; H03K 13/02
[52] U.S. Cl. .................. 340/347 P; 250/231 SE; 340/347 M
[58] Field of Search ............... 340/347 P, 347 M; 250/231 SE

[56] References Cited

U.S. PATENT DOCUMENTS

| B 503,618 | 3/1976 | Willits | 250/231 SE |
| 3,693,024 | 9/1972 | Hulle et al. | 250/231 SE |
| 3,738,504 | 6/1973 | Vail et al. | 340/347 M X |

Primary Examiner—T. J. Sloyan
Attorney, Agent, or Firm—Burns, Doane, Swecker & Mathis

[57] ABSTRACT

An optical rotary encoder comprises a body having a bottom disc portion having a first axial bearing and a cylindrical portion, an open end of which is closed by an end cap having a second axial bearing. A rotary detection shaft passes axially through the disc portion and end cap and is carried by the first and second bearings. A pair of opposing light emitting and receiving means disposed around the shaft between the bearings, so that a light beam emitted by the emitting means can be received by the receiving means through a rotary slit wheel on the shaft and a stationary slit ring plate of the body.

8 Claims, 14 Drawing Figures

COMPACT OPTIONAL ROTARY ENCODER HAVING ADJUSTABLE LIGHT ADMITTING AND RECEIVING COMPONENTS

TECHNICAL BACKGROUND OF THE INVENTION

This invention relates to rotary encoders for optically detecting a rotational position of an object.

The encoders of the type referred to are arranged such that a detection shaft is journalled rotatably within a casing, and a pair of light emitting and receiving means are opposed to each other in the casing. The light receiving means receives a light beam from the light emitting means through slits made in a stationary slit plate positioned between the light emitting and receiving means and also in a rotary slit wheel mounted on the detection shaft. Such encoders are utilized for detecting the rotational angle of the detection shaft interlocked with a rotating object to be detected in a measuring or control mechanism.

DISCLOSURE OF PRIOR ART

In detecting the rotational angle of a rotating object, generally, there have been employed such various types of devices such as optical, magnetic, contacting, electrostatic capacity detectors and, for the optical rotational-angle. detector. A prior art optical rotary encoder is shown in FIG. 1. In this encoder, a rotary sensing shaft SS is journalled in a body BD fitted in a casing CS. The shaft is journaled by means of a pair of spaced bearings BR1 and BR2 fitted to the body BD to provide for linear axial rotation of the shaft. A rotary slit disc RD is secured to an inner end of the sensing shaft SS to be rotatable within a cavity CV of the body BD. Further, a light emitting element EE is secured to the bottom of the cavity CV. A printed circuuit board PB carries a fixed slit plate FP facing the rotary slit disc RD as well as a light receiving element RE opposed to the light emitting element EE through the both slit disc and plate RD and FP. The printed circuit board PB is secured to the body BD for closing its cavity CV, so that a received-light signal processing circuit built on the substrate PB can provide on an output line OL signals indicative of the rotational position of the sensing shaft SS.

With such arrangement, a light beam being emitted from the light emitting element EE towards the light receiving element RE is received by the latter when each of circumferential slits in the rotary slit disc RD comes into alignment with a slit in the fixed plate FP in front of the light receiving element RE. Thus, a received-light signal is generated in the element RE, and this signal is processed by the signal processing circuit so as to determine the rotational angle of the sensing shaft SS and thus the rotational position of a detection object operatively associated with the other outer end of the sensing shaft SS. With this arrangement, however, there has been such a drawback that, since the sensing shaft SS is supported by the bearings BR1 and BR2 fitted to both surfaces of the body BD and an optical system (including the light emitting element EE, rotary slit disc RD, fixed slit plate FP and light receiving element RE) is arranged beyond the inner end of the shaft within the cavity CV of the body BD, the axial length of the encoder has to be at least a total of (i) the spaced distance between the bearings BR1 and BR2, (ii) the depth of the part of the cavity CV for the optical system, and (iii) the required distance from the board PB to an end of the casing CS for accommodating respective parts of the signal processing circuit. Thus the axial length of the encoder is caused to be relatively large and can hardly be minimized in size. In addition, as the printed circuit board PB carrying the fixed slit plate FP is fixed to the open end of the body BD by means of screws , it is impossible after the initial assembly to adjust the position of the slit of the fixed slit plate FP with respect to the light receiving element RE. In order to have the fixed slit plate FP disposed between the element RE and the rotary slit disc RD with a high accuracy of phase-differerĵce for achieving a high resolution, therefore, the respective constituent members must be manufactured with high accuracy, which has been a major factor of high manufacturing cost.

TECHNICAL FIELD OF THE INVENTION

A primary object of the present invention is, therefore, to provide an optical rotary encoder which is effectively minimized in size with a very simple arrangement of constituent members requiring no specifically high manufacturing accuracy and providing excellent assembling work. Such an encoder should be inexpensive while still achieving a high resolution and should have adjustable slits for achieving phase-difference accuracy.

According to the present invention, the object can be attained by forming an encoder assembly such that one of a pair of bearings is mounted in a disc-shaped portion of a body having a cylindrical portion defining a relatively large cavity. The other bearing is mounted in an end cap fitted to an open end of the cylindrical portion. A detection shaft is supported by both bearings with an inner end of the shaft being held by the other bearing in the end cap. A rotary angle detecting system including a light emitting means, rotary slit wheel, stationary slit ring plate and a printed circuit board having light receiving is arranged between the both bearings. A block including the stationary slit ring plate is made positionally adjustable from the exterior of the encoder assembly.

Other objects and advantages of the present invention shall become clear from the following description of the invention detailed with reference to preferred embodiments shown in accompanying drawings.

BRIEF EXPLANATION OF THE DRAWINGS

FIG. 3A is an exploded perspective view of a stationary slit-ring-plate block in the rotary encoder of FIG. 2, FIG. 3B is a perspective view showing a half-assembled state of the rotary encoder of FIG. 2 at a stage of performing positional adjustment with respect to the stationary slit-ring-plate block of the encoder assembly from the exterior thereof.

Figure 1:
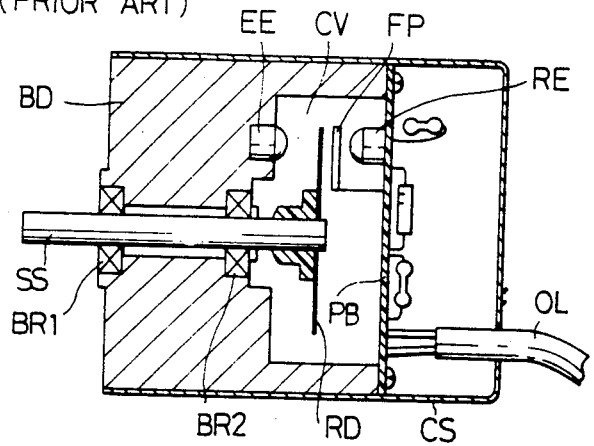
FIG. 1 is a vertical cross-sectional view of a conventional optical rotary encoder.

While the present invention shall now be described with reference to the preferred embodiments shown in the drawings, it should be understood that the intention is not to limit the invention only to the particular embodiments shown but rather to cover all alterations, modifications and equivalent arrangements possible within the scope of appended claims.

DISCLOSURE OF PREFERRED EMBODIMENT

Figure 2:
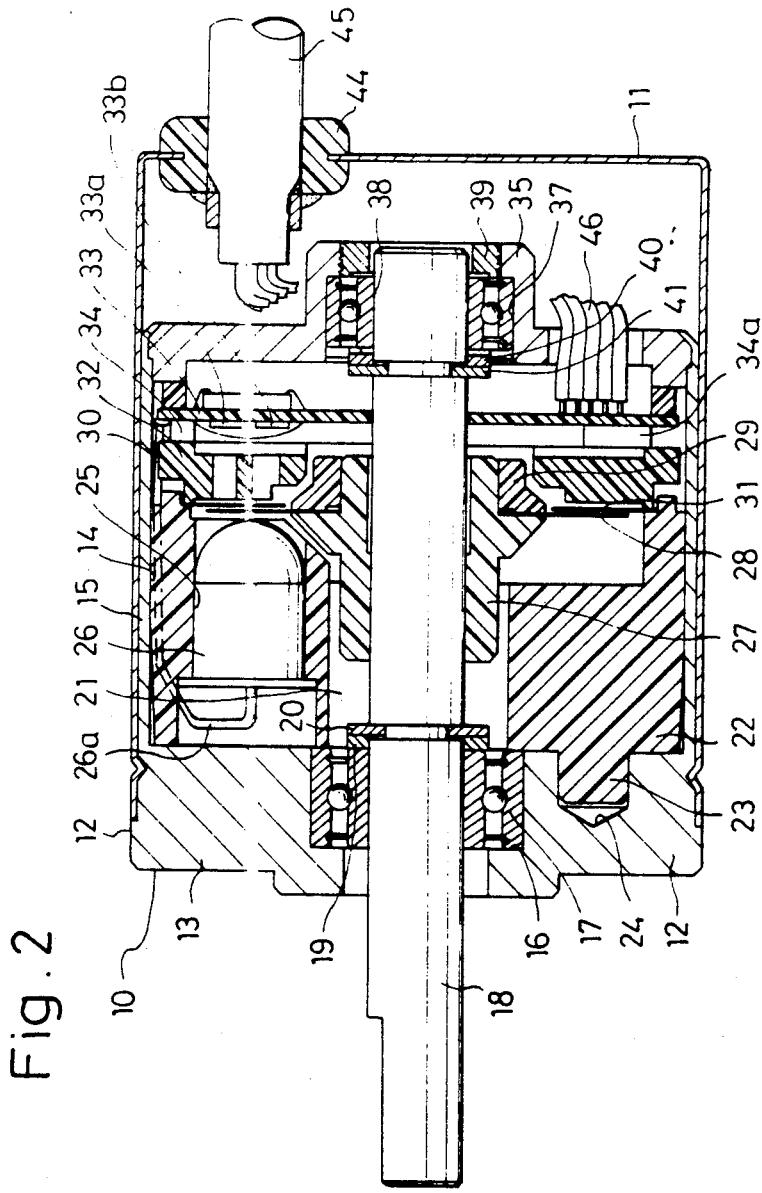
FIG. 2 is a vertical cross-sectional view of an optical rotary encoder in an embodiment according to the present invention.
Figure 3:
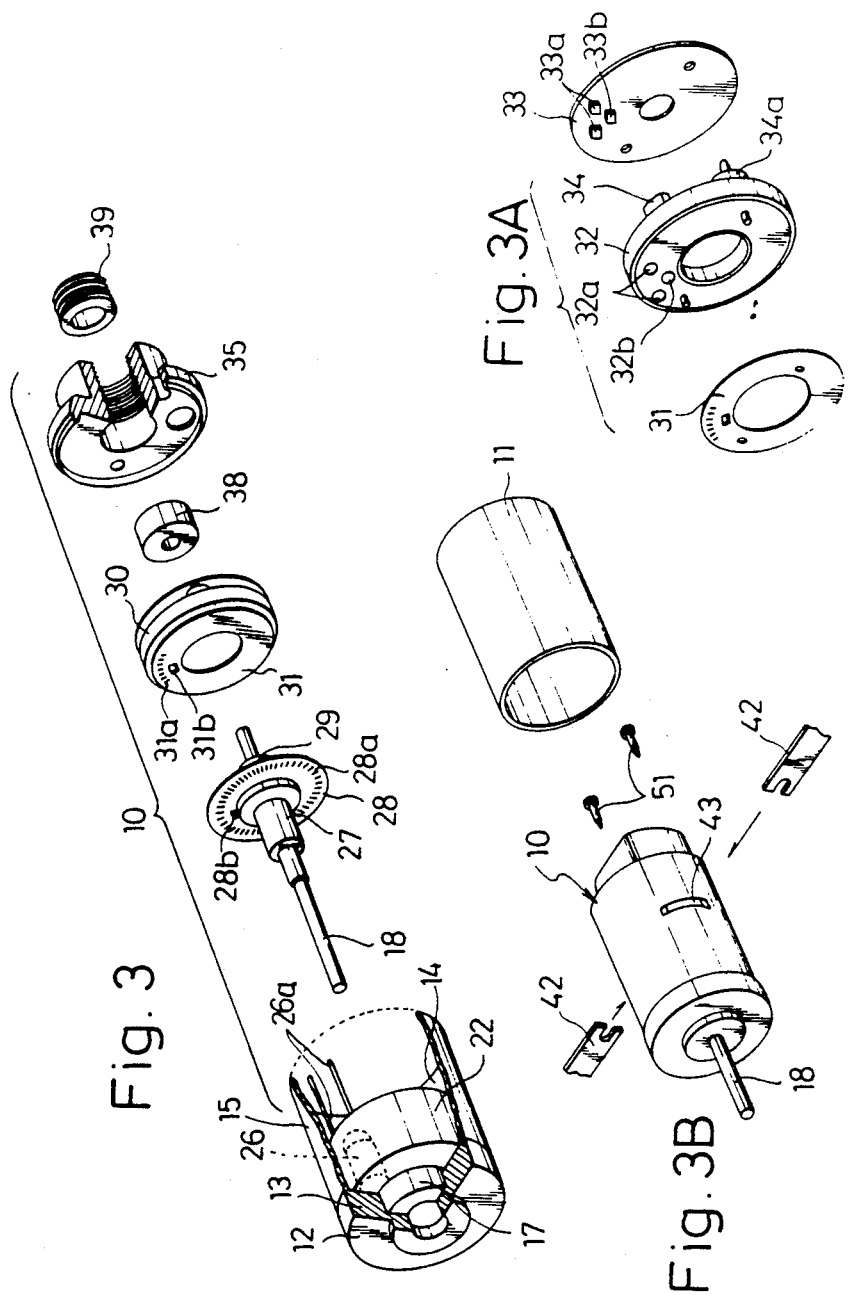
FIG. 3 is an exploded perspective view of an encoder assembly in the rotary encoder of FIG. 2.

Referring to FIGS. 2 and 3, there is shown an optical rotary encoder according to the present invention, which comprises generally an encoder assembly 10 and a casing 11 fitted to the assembly to cover it. The encoder assembly 10 comprises a body 12 preferably made of a metal and formed into a substantially cup shape having a disc-shaped bottom portion 13 and a cylindrical portion 15 defining therein a relatively large cavity 14 in which later described constituent elements are disposed. A first ball bearing 17 is mounted in an opening 16 made in the center of the disc-shaped portion 13 of the body 12 so as to hold a detection shaft 18 at an intermediate position for free axial rotation of the shaft once the latter has been inserted through the opening 16 into the cavity 14 of the cylindrical portion 15. Any axial shift of the ball bearing 17 is prevented by an E-ring 20 fitted into a circumferential groove of the detection shaft 18 and abutting internally endwise the bearing 17 by means of a spacer 19.

Fitted in the cylindrical portion 15 of the body 12 is a holding disc 22 having in the center an aperture 21 through which the detection shaft 18 extends. In the illustrated embodiment, the holding disc 22 is seated on the inner surface of the disc portion 13 with one or more projections 23 on one end face of the holding disc 22 engaged into corresponding one or more recesses 24 formed in the inner surface of the disc portion 13. The holding disc 22 has in its body a hole 25 for holding therein a light emitting element 26 such as an infrared-ray LED so that a light emitting side end of the element 26 is recessed slightly inside the other end face of the holding disc 22. The detection shaft 18 carries a bushing 27 mounted about the shaft 18 at its position inside the cylindrical portion 15 of the body 10, by forcibly inserting the shaft into an axial through-hole of the bush 27. A rotary slit wheel 28 is held on the bush 27 so as to be oriented perpendicularly relative to the shaft 18. The wheel 28 is secured against a radial flange of the bush 27 by means of a securing member 29 so as to be rotatable with the shaft.

A stationary slit-ring-plate block 30 is disposed within the cylindrical portion 15 of the body 12. The detection shaft 18 passes through an axial opening of the block 30, so that the block 30 opposes the light emitting element 26 through the rotary slit wheel 28 interposed between them. This block 30 comprises a stationary slit ring plate 31, a block disc 32 and a printed circuit board 33, which are provided respectively with a central hole for forming the axial opening of the block 30. The stationary slit ring plate 31 is fixed to one surface of the block disc 32 on the side opposing the element 26, preferably by fitting projections on the block disc 32 into corresponding holes made in the slit ring plate 31. The printed circuit board 33 is secured to the other side surface of the block disc 32 and is spaced therefrom by means of spacing projections 34 and 34a of the block disc 32. In this case, it is also preferable that the printed circuit board 33 is fixed to the disc 32 similarly by fitting projected pins on the spacing projections of the block disc 32 into corresponding holes in the printed circuit board 33, as in the case of the stationary slit ring plate 31 (refer especially to FIG. 3A).

Figure 4:
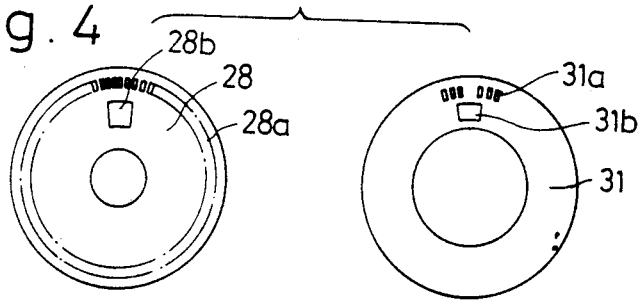
FIG. 4 shows front views of a rotary slit wheel and a stationary slit ring plate in the rotary encoder of FIG. 2.

As seen best in FIG. 4, the rotary slit wheel 28 is provided with a plurality of position signalling slits 28a disposed along the outer periphery of the wheel 28 and a single origin signalling hole 28b is disposed radially inside the slits 28a. The stationary slit ring plate 31 is provided with a smaller number of position signalling slits 31a disposed along the outer periphery of the plate 31 but over a restricted circumferential length. A single origin signalling hole 31b is positioned radially inside of those slits 31a, the slits 31a being divided into two groups mutually different in phase with respect to the center of the plate 31. Referring back to FIG. 3A, the block disc 32 is provided with two position signalling through holes 32a at positions radially corresponding to the slits 31a of the plate 31, and with an origin signalling through hole 32b likewise corresponding to the hole 31b. When the block 30 is assembled in the foregoing disposition, the respective position signalling slits and holes 28a, 31a and 32a and origin signalling holes 28b, 31b and 32b are all opposed to the light emitting element 26 in radial positional relation to the axis of the detection shaft 18, and the printed circuit board 33 is provided with two position-signalling light receiving elements 33a opposing the position signalling holes 32a in the disc 32 and with an originsignalling light receiving element 33b opposing the origin signalling hole 32b, which elements being, for example, a photo. Soldered to a circuit (to be described later) on the board 33, are lead wires 26a of the light emitting element 26 which are led out of the holding disc 22 and block 30 preferably along their periphery.

Figure 5:
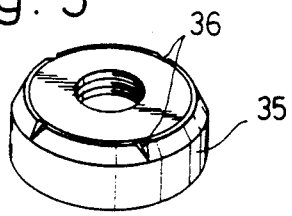
FIG. 5 is a partial perspective view in another embodiment of an end cap in the rotary encoder according to the present invention.

An end cap 35 is secured to an open end of the cylindrical portion 15 of the body 12 by, for example, peening the end edge of the portion 15 with a cone-shaped punch or the like. In this case, preferably, one or more V-shaped notches 36 are provided in a tapered peripheral edge surface of the end cap 35 as shown in FIG. 5, so that the peening edge of the cylindrical portion 15 will enter the notches 36 so as to prevent the cap 35 from rotating in the secured position. The end cap 35 is provided at its center with an opening 37, and a second ball bearing 38 is mounted in the opening 37 so as to rotatably support the inner end of the detection shaft 18 while maintaining its axial center position in the cylindrical portion 15. An outer end portion of the opening 37 in the cap 35 is peripherally threaded, and a screw ring 39 is screwed into the opening 37 so as to adjustably abut against the outer end of the ball bearing 38. Axial displacement of the ball bearing 38 is prevented by an E ring 41 fitted into a circumferential groove of the shaft 18 to abut through a spacer 40 against the inner end of the ball bearing 38. When the screw ring 39 is strongly pressed against the second ball bearing 38, therefore, axial play of the ball bearing 38 as well as the detection shaft 18 and eventually the first bearing 17 can be reliably prevented.

As will be clear from FIG. 3B, the cylindrical portion 15 is provided with one or more adjustment slits 43 through which a jig 42 can be inserted from the exterior into the cylindrical portion 15 to adjust the angular position of the stationary slit-ring-plate block 30. For this purpose, the block 30 is held frictionally in position between the disc 22 and the cap 35 for frictional axial rotation. Since the circuit board 33 and the slit plate 31 are connected to the block 30 as described earlier herein, those members are rotatable together as a unit. The casing 11 fitted over the cap 35 to the cylindrical portion 15 of the body 10 is provided with a cable bush 44 through which a cable 45 is passed in an air-tight manner, and power supply and output lines 46 of the cable 45 are connected to the printed circuit board 33.

Figure 6:
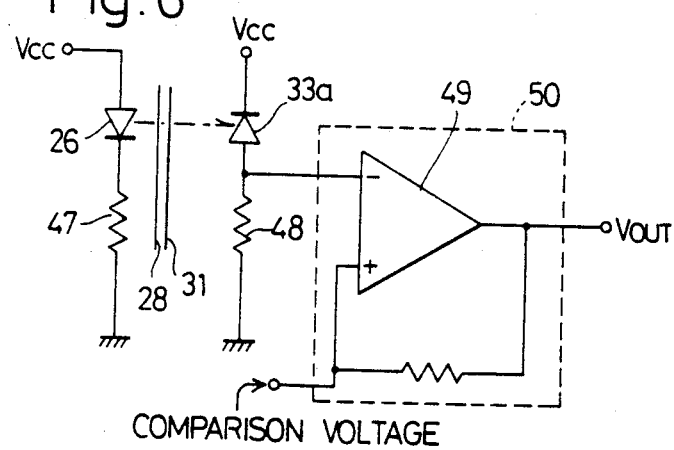
FIG. 6 shows a signal processing circuit including light emitting and receiving means in the rotary encoder of FIG. 2.
Figure 7:
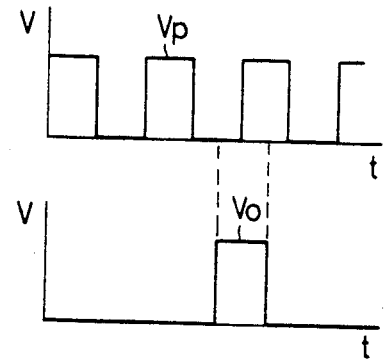
FIG. 7 shows waveforms of an output and an origin signal of the circuit of FIG. 6.

Next, the signal processing circuit including the light emitting element 26 and light receiving elements 33a and 33b shall be explained by reference to FIG. 6. In the drawing, only one one light emitting element 26 and light receiving element 33a are shown, but it will be appreciated that a plurality of each may be provided. As illustrated, the light emitting element 26 is connected at its one end to a resistance 47 which in turn is grounded at the other end, and a power source voltage $V_{cc}$ is applied to the other end of the element 26 so that the element can emit light. On the other hand, the light receiving element 33a for receiving a beam of emitted light through the slits of the rotary wheel 28 and stationary ring plate 31 is supplied at one end with the power source voltage $V_{cc}$ and is connected at the other end to a resistance 48 which in turn is grounded at the other end. Therefore, when the light receiving element 33a receives the light beam, the resistance 48 causes an output voltage of the element to appear at an input terminal of a comparator 49. Since the comparator 49 also receives a comparison voltage at the other input terminal, a Schmitt trigger circuit 50 including the comparator 49 can generate a position signal $V_P$ of square wave having a duty ratio of 50% as shown in FIG. 7, on the basis of a comparison level.

Now, the operation of the optical rotary encoder as has been described above shall be briefly explained. When the detection shaft 18, coupled to a rotary object to be detected e.g., a control mechanism of, an automatic production machine, is rotated with the object, the rotary slit wheel 28 is also rotated relative to the stationary slit ring plate 31. Provided that the wheel 28 and plate 31 respectively have the same number of position signalling slits, e.g., 16 slits, then the light beam from the light emitting element 26 is caused to be incident through the hole 32a of the block disc 32 on the light receiving element 33a substantially as 4-bit series signals. Further, since the wheel 28 and plate 31 have the origin signalling holes 28b and 31b, respectively, the other light receiving element 33b receives a light beam through the hole 32b of the block disc 32 upon each rotation by 360 degrees of the rotary slit wheel 28. As a result, the signal processing circuit of FIG. 6 generates a position signal $V_P$ and an origin signal $V_O$ as shown in FIG. 7. When the position signal $V_P$ is subjected to an operation with respect to the origin signal $V_O$ with a known arithmetic circuit, the rotational angle of the detection shaft 18 and thus the rotational position of the object can be detected.

Figure 8:
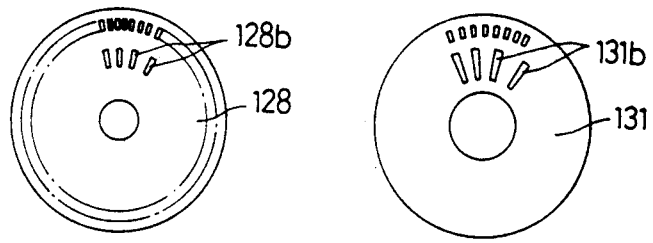
FIG. 8 shows front views in another embodiment of the rotary slit wheel and stationary slit ring plate of the rotary encoder according to the present invention.
Figure 9:
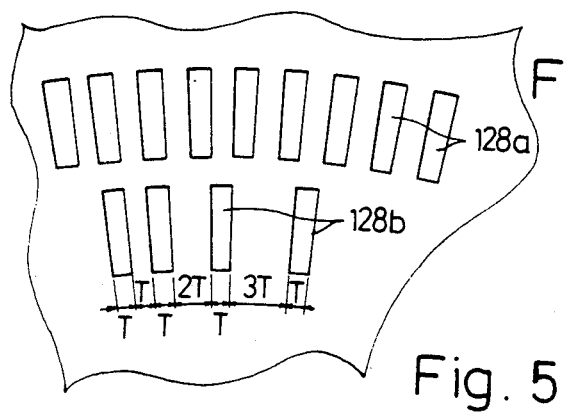
FIG. 9 is a fragmentary magnified view of the rotary slit wheel of FIG. 8 for showing its slits in detail.
Figure 10:
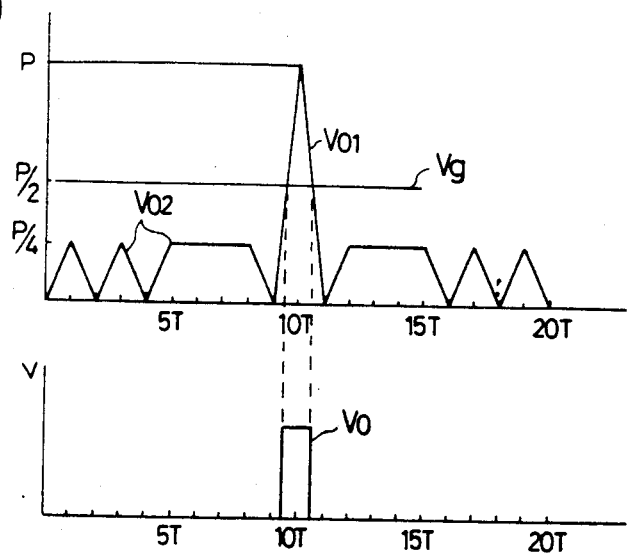
FIG. 10 shows waveforms of an output and origin signal of the circuit of FIG. 6 when the rotary slit wheel and stationary slit ring plate of FIG. 8 are used.

In another embodiment shown in FIG. 8, a plurality of origin signalling holes 128b and 131b are provided respectively in a rotary slit wheel 128 and a stationary slit ring plate 131, which holes are arranged substantially in the same manner as shown in detail as magnified in FIG. 9. As seen in the drawing, the origin signalling holes 128b (or 131b), which in number, are shown here to be four are elongated in the radial direction, and have a circumferential width T while they are spaced at varying circumferential intervals sequentially enlarged from T to 2T and 3T. With the rotation of these holes 128b of the wheel 128 with respect to these holes 131b of the stationary ring plate 131, it is found that the origin signalling light receiving element 33b generates a sharply rising high output $V_{O1}$ and low output voltages $V_{O2}$ as shown in FIG. 10, the output $V_{O1}$ being much higher than the outputs $V_{O2}$. That is, when the output $V_{O1}$ is of a level P, the outputs $V_{O2}$ are of a level of about P/4. Accordingly, when the comparison voltage level is set to be P/2, so that one origin signal output can be obtained upon each rotation of the wheel 128, it is possible to obtain a square wave output as shown by $V_O$ in FIG. 10 by shaping the waveform of the sharp output $V_{O1}$ at the level P/2. In the case of FIG. 4 in which the circumferential width of the origin signalling holes 28b and 31b is made large in order to increase the amount of received light, there is, practice, a risk that the received light output does not exceed the comparison voltage level due, for example, to variations in the ambient temperature secular variations in the characteristics of constituent members, and the like. When the origin signalling holes are arranged as shown in FIGS. 8 and 9, however, the origin signal $V_O$ can be reliably obtained becauae the rising level of the received-light output $V_{O1}$ can be made very high. It should be readily understood that, when the origin signalling holes 128b and 131b are provided to be, for example, six in each of the rotary wheel 128 and stationary ring plate 131, the circumferential spacings between the respective holes 128b or 131b are sequentially enlarged to be T, 2T, 3T, 5T and 7T with respect to the width T of each hole.

A brief explanation shall be made as to how the rotary encoder according to the present invention is assembled. The first ball bearing 17 is mounted in the opening 16 of the holding disc 22, and then the holding disc 22 having the light emitting element 26 already held therein is fixedly mounted on the inner bottom surface of the disc-shaped portion 13 and, if necessary, secured thereto by means of fastening screws. Next, the detection shaft 18 having thereon the rotary slit wheel 28, already secured by the holding bush 27 and securing member 29, is inserted from its outer end into the first ball bearing 17. When the detection shaft 18 is inserted into the holding bush 27, distortions of the holding bush 27 and a resultant shifting of the rotary slit wheel 28 is avoided by making the diameter of a portion of the shaft insert hole in the bush 27 larger than the diameter of the shaft. When the detection shaft 18 is inserted into the first ball bearing 17, on the other hand, the spacer 19 and E ring 20 on the shaft 18 ensure that the ball bearing 17 is properly positioned.

Figure 11:
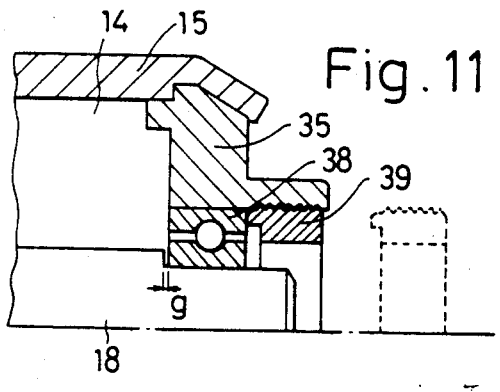
FIG. 11 is a fragmentary cross-sectional view at the end cap of the rotary encoder of FIG. 2 for explaining assembling work of a shaft bearing thereto.

Further, the stationary slit-ring-plate block 30 is disposed to abut against the inner end edge surface of the holding disc 22. The end cap 35, having the second ball bearing 38 in the opening 37, is mounted over the inner ends of the detection shaft 18 and the block 30 so that the inner shaft end is inserted into the bearing 38. Then the open end of the cylindrical portion 15 of the body 12 is peened to fix thereto the end cap 35. The screw ring 39 is screwed adjustingly into the threaded part of the hole 37 in the end cap 35 so as to press the second bearing 38 forwardly away from the outer end face of the end cap 35. Any existing clearance "g" between the bearing 38 and a stepped part of the detection shaft 18 as shown in FIG. 11 can be removed, whereby exial play of the related members with respect to the shaft 18 can be effectively prevented.

Figure 12:
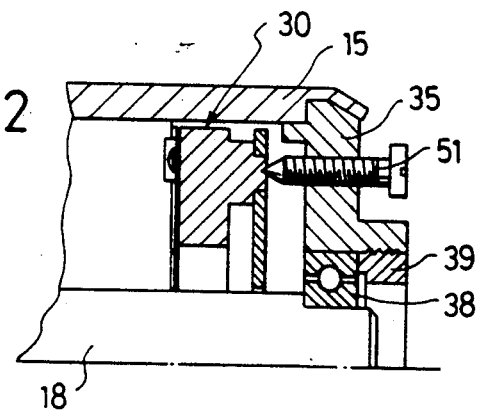
FIG. 12 is a fragmentary cross-sectional view at the stationary slit-ring-plate block and end cap in the rotary encoder of FIG. 2 for explaining their assembling work.

Next, in order to provide a predetermined phase difference to the waveform of the received-light output, it is necessary to properly set the rotational angular position of the stationary slit ring plate 31 with respect to the rotary slit wheel 28 and the emitted light beam. The predetermined phase difference can be realized by rotating the block 30 along with the slit ring plate 31, relative to the rotary slit wheel 28, while monitoring the phase difference of the received-light output of the light receiving elements with the light beam incident thereon from the element 26. After this adjustment, the block 30 may be fixed at the set angular position by causing a sharp tip end of a securing set screw 51 to bite into the block 30, as seen in FIG. 12. There is thus attained, with respect to the light beam from the light emitting element 26, a proper alignment of the slits 28a and hole 28b of the rotary slit wheel 28, the slits 31a and hole 31b of the stationary slit ring plate 31 (through holes 32a and 32b of the block disc 32), and the light receiving elements 33a and 33b for obtaining an output signal having a predetermined phase difference. Since the light emitting element 26 is contained within the holding hole 25 of the holding disc 22 such that the tip end of the element is offset inwardly from the end edge of the hole 25, the light beam emitted from the element 26 which otherwise would tend to diffuse radially outward will instead be reflected by the inner peripheral surface of the holding hole 25, so as to be emitted from the element 26 and out of the hole 25 concentrically into a beam, effectively increasing the amount of light received by the light receiving elements.

With respect to the thus assembled encoder assembly 10, the casing 11 having the cable 45 passed therethrough is fitted over the end cap 35 to the body 12, so as to surround the cylindrical portion 15 of the body 12. An inward projection at a leading end of the casing 11 is inserted into a notch in the periphery of the disc-shaped portion 13 as seen in FIG. 2.

What is claimed as our invention is:

1. An optical rotary encoder comprising:
   a body including
      a disc-shaped portion, and
      a cylindrical portion projecting from said disc-shaped portion and defining a cavity, said cylindrical portion including slit means therethrough communicating with said cavity,
   an end cap closing an end of said cylindrical portion remote from said disc-shaped portion,
   a first bearing mounted centrally in said disshaped portion,
   a second bearing mounted centrally in said end cap and being axially slidable therein,
   axially adjustable retaining means for retaining said second bearing in said end cap and for eliminating axial play of said second bearing,
   a detection shaft journaled in said first and second bearings,
   light emitting means mounted in said body,
   a rotary slit wheel fixed on said detection shaft within said cavity for rotation therewith, said rotary slit wheel including position signaling slits, and at least one original signaling hole, said slits and hole being arranged to oppose said light emitting means,
   a stationary slit plate disposed within said cavity and including position signaling slits and at least one origin signaling hole, said slits and hole being arranged to oppose said light emitting means, said stationary slit plate opposes a side of said rotary slit wheel opposite said light emitting means such that said rotary slit wheel is disposed between said light emitting means and said stationary slit plate,
   a printed circuit board disposed within said cavity and including light receiving means for receiving light from said light emitting means which has passed through said position signaling slits and said original signaling holes of said rotary slit wheel and stationary slit plate,
   a block disc interposed between said stationary slit plate and said circuit board for interconnecting said stationary slit plate and said circuit board, said block disc including holes for admitting light from said position signaling slits and original signaling hole of said stationary slit plate,
      said block disc, said stationary slit plate and said circuit board being interconnected as a unit for common rotational adjustment by means of an external force applied through said slit means of said cylindrical portion, to adjust the angular position of said unit relative to said rotary slit wheel, and
   securing means for securing said unit in its adjusted angular positions.

2. A rotary encoder according to claim 1, wherein a plurality of said original signaling holes are provided on each of said rotary slit wheel and stationary slit plate, and spacings between respective original signaling holes in each of the rotary slit wheel and stationary slit plate are sequentially increased.

3. A rotary encoder according to claim 1, including a bushing carrying said rotary slit wheel, said detection shaft mounted in an axial through-hole of said bushing, a portion of said through-hole having a larger diameter than said shaft.

4. A rotary encoder according to claim 1, including a holding disc disposed within said cavity and engaging an inner bottom surface of said disc-shaped portion, said holding disc including a holding hole opening in a direction away from said inner bottom surface, said light emitting means mounted in said holding hole.

5. A rotary encoder according to claim 4, wherein said light emitting means has lead wires extended through said holding disc and said block disc to said printed circuit board to be electrically connected to a circuit on the board.

6. A rotary encoder according to claim 1, wherein said axially adjustable retaining means comprises a screw ring threadedly mounted to said end cap.

7. A rotary encoder according to claim 1, wherein said securing means comprises a set screw passing through said end cap and engaging said block disc.

8. A rotary encoder according to claim 1, wherein said end cap includes a tapered outer surface facing said cylindrical portion, said outer surface including at least one notch receiving an end of said cylindrical portion to resist relative rotation between said cylindrical portion and said end cap.

* * * * *